United States Patent
Fitzpatrick

(10) Patent No.: US 8,433,239 B2
(45) Date of Patent: Apr. 30, 2013

(54) DATA RECEIVING CIRCUIT WITH CURRENT MIRROR AND DATA SLICER

(75) Inventor: John James Fitzpatrick, Indianapolis, IN (US)

(73) Assignee: Thomson Licensing, Boulogne-Billancourt (FR)

(*) Notice: Subject to any disclaimer, the term of this patent is extended or adjusted under 35 U.S.C. 154(b) by 634 days.

(21) Appl. No.: 11/666,482

(22) PCT Filed: Oct. 26, 2005

(86) PCT No.: PCT/US2005/038506
§ 371 (c)(1), (2), (4) Date: Apr. 27, 2007

(87) PCT Pub. No.: WO2006/052450
PCT Pub. Date: May 18, 2006

(65) Prior Publication Data
US 2007/0296469 A1 Dec. 27, 2007

Related U.S. Application Data

(60) Provisional application No. 60/624,661, filed on Nov. 3, 2004.

(51) Int. Cl.
*H04H 20/74* (2008.01)
*H02M 11/00* (2006.01)

(52) U.S. Cl.
USPC .......................................... 455/3.02; 327/103

(58) Field of Classification Search .................. None
See application file for complete search history.

(56) References Cited

U.S. PATENT DOCUMENTS

| 4,412,186 | A | * | 10/1983 | Nagano | 330/288 |
| 4,942,593 | A | * | 7/1990 | Whiteside et al. | 375/372 |
| 4,961,009 | A | * | 10/1990 | Baik | 327/103 |
| 5,289,278 | A | * | 2/1994 | Bird | 348/473 |
| 5,319,514 | A | | 6/1994 | Walsh et al. | |
| 5,412,692 | A | * | 5/1995 | Uchida | 375/317 |
| 5,539,772 | A | | 7/1996 | Fasulo, II et al. | |

(Continued)

FOREIGN PATENT DOCUMENTS

| CA | 2215976 | 10/1996 |
| CN | 1487520 | 4/2004 |

(Continued)

OTHER PUBLICATIONS

Djemouai, A. et al: "Integrated ASK Demodulator Dedicated to Implantable Electronic Devices", IEEE, US. vol. 1; Dec. 27, 2003, pp. 80-83 . . . submitted in PDF format.*

(Continued)

*Primary Examiner* — Zhiyu Lu
*Assistant Examiner* — Ayodeji Ayotunde
(74) *Attorney, Agent, or Firm* — Robert D. Shedd; Kuniyuki Akiyama

(57) ABSTRACT

A data receiving circuit is capable of properly receiving current modulated signals having a wide range of frequencies. According to an exemplary embodiment, the data receiving circuit includes a current mirror operative to receive a current modulated signal from an external device and to convert the current modulated signal to a voltage signal. A data slicer is operative to generate digital data responsive to the voltage signal.

25 Claims, 6 Drawing Sheets

U.S. PATENT DOCUMENTS

| | | | |
|---|---|---|---|
| 5,649,318 | A | 7/1997 | Lusignan |
| 5,886,546 | A * | 3/1999 | Hwang .................. 327/103 |
| 5,937,004 | A | 8/1999 | Fasulo, II et al. |
| 5,945,878 | A | 8/1999 | Westwick et al. |
| 6,252,633 | B1 * | 6/2001 | Ruitenburg ................ 348/725 |
| 6,693,587 | B1 | 2/2004 | Kuether et al. |
| 6,714,608 | B1 | 3/2004 | Samueli et al. |
| 6,791,624 | B1 | 9/2004 | Suga |
| 7,429,854 | B2 | 9/2008 | Kimura |
| 2004/0028149 | A1 | 2/2004 | Krafft et al. |
| 2004/0042368 | A1 | 3/2004 | Kwag et al. |
| 2006/0091940 | A1 | 5/2006 | Kimura |

FOREIGN PATENT DOCUMENTS

| | | |
|---|---|---|
| EP | 1089469 | 4/2001 |
| GB | 2094583 | 3/1982 |
| GB | 2311425 | 9/1997 |
| GB | 2347055 | 8/2000 |
| JP | 63/296418 | 12/1988 |
| JP | 1989-68030 | 3/1989 |
| JP | 6468030 | 3/1989 |
| JP | 7-297872 | 11/1995 |
| JP | 7/297872 | 11/1995 |
| JP | 1997/74555 | 3/1997 |
| JP | 1998/4367 | 1/1998 |
| JP | 1998/13276 | 1/1998 |
| JP | 1998/190505 | 7/1998 |
| JP | 1999-261500 | 9/1999 |
| JP | 11261500 | 9/1999 |
| JP | 2000/36847 | 2/2000 |
| JP | 2001/119644 | 4/2001 |
| JP | 2001/168936 | 6/2001 |
| JP | 2002/76795 | 3/2002 |
| JP | 2006/133869 | 5/2006 |
| KR | 19990049717 | 7/1999 |
| WO | WO 01/06379 | 1/2001 |
| WO | WO 01/71922 | 9/2001 |

OTHER PUBLICATIONS

Taniguchi K. et al.: "Bi-CMOS current mode multiple valued logic circuits with 1.5V supply voltage" Proceedings of the International Symposium on Multiple valued Logic. Sendai, May 27-29, 1992, Los Alamitos, IEEE Comp. Soc. Press, US vol. SYMP. 22, May 27, 1992, pp. 216-220.

European Telecommunications Satellite Organization: "Technical Recommandations for Manufacturers of DTH and SMATV Receiving Equipment—DiSEqC Version 4.0—Bus Functional Specification" Int, Mar. 22, 1996 XP002149629 p. 2, line 12-line 26.

Search Report Dated Feb. 24, 2006.

Djemouai, A. et al: Integrated ASK Demodulator Dedicated to Implantable Electronic Devices; Midwest Symposium on Circuits and Systems. Cairo, Egypt, Dec. 27-30, 2003; [Midwest Symposium on Circuits and Systems], Piscataway, NJ, IEEE, US. vol. 1; Dec. 27, 2003, pp. 80-83 XP010867395, DOI:DOI:10.1109/MWSCAS.2003. 1562223 ISBN: 978-0-7803-8294-7.

* cited by examiner

DATA RECEIVING CIRCUIT WITH CURRENT MIRROR AND DATA SLICER

CROSS REFERENCE TO RELATED APPLICATION

This application claims the benefit, under 35 U.S.C. §365 of International Application PCT/US05/038506 filed Oct. 26, 2005, which was published in accordance with PCT Article 21(2) on May 18, 2006 in English and which claims the benefit of U.S. provisional patent application No. 60/624,661 filed Nov. 3, 2004.

BACKGROUND OF THE INVENTION

1. Field of the Invention

The present invention generally relates to data communication for purposes such as Digital Satellite Equipment Control (DiSEqC), and more particularly, to a data receiving circuit that is capable of properly receiving current modulated signals having a wide range of frequencies.

2. Background Information

Data communication for DiSEqC has historically been performed through the modulation of a 22 kHz voltage tone. This modulated tone may be superimposed onto a direct current (DC) voltage that powers one or more low noise blocks (LNBs) of a satellite receiving system. Using DiSEqC, an integrated receiver/decoder (IRD) apparatus (e.g., set-top box, etc.) may for example transmit signals via a transmission medium such as coaxial cable that enable selection and control of a particular LNB via a switching unit. DiSEqC communication may also include a return channel (e.g., on the same transmission medium) in which current modulated signals are transmitted from the LNB and/or switching unit back to the IRD apparatus.

IRD apparatuses may include dedicated circuitry for receiving the current modulated signals provided via the return channel. FIG. 1 shows a data receiving circuit according to conventional art that may be used to receive current modulated signals via a DiSEqC return channel. In particular, the conventional data receiving circuit of FIG. 1 includes RLC circuitry for converting a pulsed 45 mA current modulated signal provided from an LNB or switching unit to a semi-sinusoidal voltage signal. A depiction of the pulsed current modulated signal and the resultant semi-sinusoidal voltage signal for two different frequencies is shown in FIGS. 2 and 3. In FIG. 1, the resultant semi-sinusoidal voltage signal is sliced by a subsequent data slicer circuit to generate a sliced digital output signal which may then be envelope and edge detected by a processor (not shown in FIG. 1).

With the conventional data receiving circuit of FIG. 1, problems may arise when the current modulated signal provided from the LNB or switching unit exhibits different frequencies. In particular, when the current modulated signal exhibits different frequencies, the semi-sinusoidal voltage signal provided by the RLC circuitry exhibits inconsistent amplitudes which can create processing errors in the aforementioned data slicing, envelope detection and edge detection functions. These amplitude inconsistencies are evident from the waveforms shown in FIGS. 2 and 3. In FIG. 2, for example, waveforms are shown for the current modulated signal provided from the LNB or switching unit at a frequency of 22 kHz (i.e., lower waveform), and the resultant semi-sinusoidal voltage signal provided by the RLC circuitry (i.e., upper waveform).

The waveforms of FIG. 2 may be contrasted with the waveforms of FIG. 3. In FIG. 3, waveforms are shown for the current modulated signal provided from the LNB or switching unit at a frequency of 88 kHz (i.e., lower waveform), and the resultant semi-sinusoidal voltage signal provided by the RLC circuitry (i.e., upper waveform). Comparing the voltage waveforms of FIGS. 2 and 3, it is evident that the amplitude of the semi-sinusoidal voltage signal provided by the RLC circuitry decreases as the frequency of the current modulated signal provided from the LNB or switching unit increases. In this manner, the amplitude of the semi-sinusoidal voltage signal provided by the RLC circuitry of FIG. 1 is dependent upon the frequency of current modulated signal provided from the LNB or switching unit. When the amplitude of the semi-sinusoidal voltage signal provided by the RLC circuitry is below a given threshold, processing errors may occur in the aforementioned data slicing, envelope detection and edge detection functions.

Accordingly, there is a need for a data receiving circuit capable of avoiding the foregoing problems by properly receiving current modulated signals having a wide range of frequencies. The present invention addresses these and/or other issues.

SUMMARY OF THE INVENTION

In accordance with an aspect of the present invention, a data receiving circuit is disclosed. According to an exemplary embodiment, the data receiving circuit comprises a current mirror operative to receive a current modulated signal from an external device and to convert the current modulated signal to a voltage signal. A data slicer is operative to generate digital data responsive to the voltage signal.

In accordance with another aspect of the present invention, a method for receiving a current modulated signal is disclosed. According to an exemplary embodiment, the method comprises receiving the current modulated signal from an external device, using a current mirror to convert the current modulated signal to a voltage signal, and generating digital data responsive to the voltage signal.

In accordance with another aspect of the present invention, an apparatus is disclosed. According to an exemplary embodiment, the apparatus comprises current mirroring means for receiving a current modulated signal from an external device and converting the current modulated signal to a voltage signal. Data slicing means generates digital data responsive to the voltage signal.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein.

The exemplifications set out herein illustrate preferred embodiments of the invention, and such exemplifications are not to be construed as limiting the scope of the invention in any manner.

DESCRIPTION OF THE PREFERRED EMBODIMENTS

Figure 4:
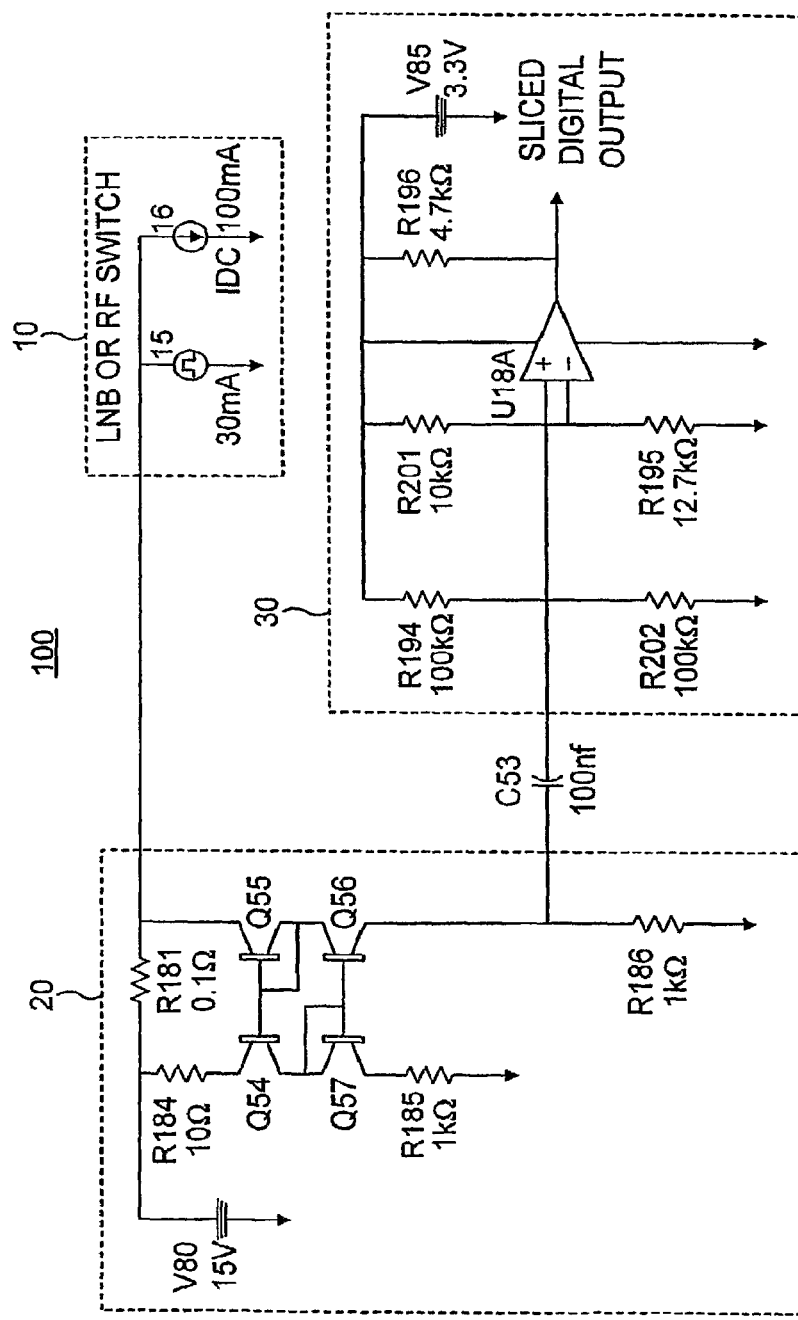
FIG. 4 shows circuitry including a data receiving circuit according to an exemplary embodiment of the present invention.

Referring now to the drawings, and more particularly to FIG. 4, circuitry 100 including a data receiving circuit according to an exemplary embodiment of the present invention is shown. Circuitry 100 of FIG. 4 comprises an external device 10, and a data receiving circuit including current mirroring means such as current mirror 20 and data slicing means such as data slicer 30. Preferred values for many of the circuit elements are shown in FIG. 4, although different values may also be used.

According to an exemplary embodiment, circuitry 100 of FIG. 4 represents a portion of a satellite receiving system in which external device 10 represents a portion of an LNB and/or radio frequency (RF) switch, and the data receiving circuit represents a portion of an IRD apparatus (e.g., set-top box, etc.) used to receive and process signals including satellite signals. Accordingly, circuitry 100 of FIG. 4 may be used for DiSEqC, and/or for other types of data communication. The data receiving circuit of FIG. 4 may also be implemented in other types of systems and/or devices such as television signal receivers and/or other devices.

External device 10 comprises current means such as a 22 kHz, 30 mA pulsed current sink 15 and a fixed current sink 16 of 100 mA. These two currents sum together and draw current from voltage source V80. The resulting current may be modulated using any suitable modulation technique by a modulation controller (not shown in FIG. 4) and provided to current mirror 20 as a current modulated signal via a transmission medium such as coaxial cable and/or other medium. According to an exemplary embodiment, this current modulated signal may represent a return channel signal provided for purposes of DiSEqC.

Current mirror 20 comprises voltage means such as voltage source V80, resistance means such as resistors R181 and R184 to R186, and switching means such as transistors Q54 to Q57. As indicated in FIG. 4, transistors Q54 and Q55 are pnp-type bipolar junction transistors (BJTs), and transistors Q56 and Q57 are npn-type BJTs. Although BJTs are used in the exemplary embodiment of FIG. 4, field effect transistors (FETs) could also be used. Transistors Q54 to Q57 are operatively coupled in the manner shown in FIG. 4. In particular, the base terminal of transistor Q54 is operatively coupled to the base terminal of transistor Q55, and the base terminal of transistor Q57 is operatively coupled to the base terminal of transistor Q56. The collector terminal of transistor Q54 is operatively coupled to the collector terminal of transistor Q57, and the collector terminal of transistor Q55 is operatively coupled to the collector terminal of transistor Q56. Moreover, the base terminals of transistors Q54 and Q55 are operatively coupled to the collector terminals of transistors Q55 and Q56, and the base terminals of transistors Q56 and Q57 are operatively coupled to the collector terminals of transistors Q54 and Q57.

In operation, the current modulated signal provided from external device 10 flows through resistor R181 of current mirror 20 where a voltage proportional to the current is dropped across it. Current mirror 20 conducts and maintains substantially the same current in each of its two signal paths, namely the signal path defined by transistors Q54 and Q57 (i.e., the left leg of current mirror 20) and the signal path defined by transistors Q55 and Q56 (i.e., the right leg of current mirror 20). In this manner, the current in the left leg of current mirror 20 is "mirrored" in its right leg due to the configuration of transistors Q54 to Q57 and the fact that resistors R185 and R186 have the same resistance. The voltage across resistor R184 is approximately the same as the voltage across resistor R181. The voltage across resistor R184 divided by its resistance determines the current in the right and left legs of current mirror 20. The voltage across resistors R185 and R186 is proportional to the current flowing through resistor R181, and is referenced to ground. The operation of current mirror 20 produces a current to voltage conversion, which according to an exemplary embodiment is approximately 10 millivolts per milliamp (mV/mA). The converted voltage signal produced by current mirror 20 is AC coupled to data slicer 30 via capacitance means such as capacitor C53.

Data slicer 30 comprises voltage means such as voltage source V85, resistance means such as resistors R194 to R196, R201 and R202, and signal comparing means such as comparator U18A. Resistors R194 and R202 of data slicer 30 produce a 50% voltage divider. Resistors R195 and R201 of data slicer 30 produce a voltage divider that is slightly greater than 50%. It is this difference in reference points that must be overcome in order for data slicer 30 to reach the threshold of detection. This detection threshold gives the data receiving circuit of FIG. 4 its noise immunity margin. With the data receiving circuit of FIG. 4, the current modulation needs to reach 30 mA of current excursion to breach the detection threshold and enable comparator U18A to provide a valid digital output signal. The sliced digital output signal of comparator U18A is provided to a peak detector circuit and in turn to a processor (neither of which are shown in FIG. 4) where edge detection and timing to demodulate intelligent signals takes place.

Figure 1:
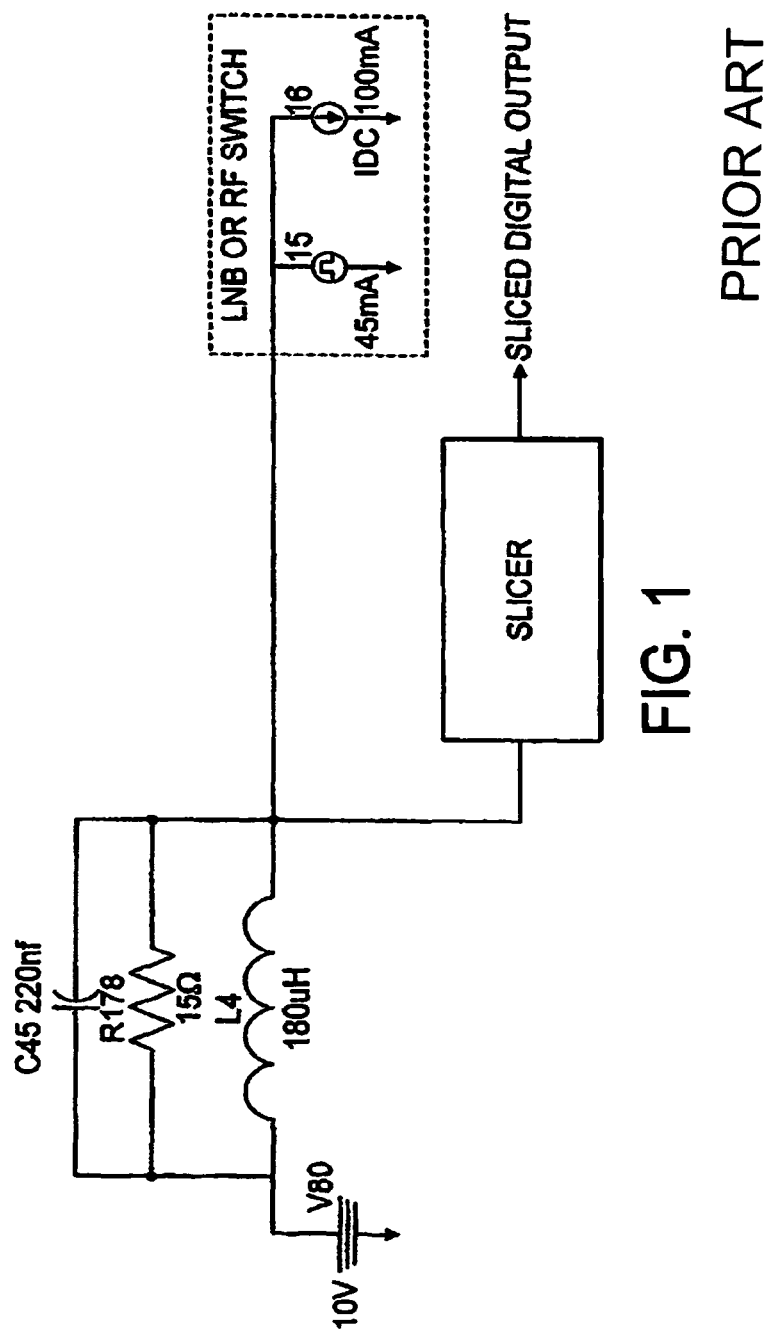
FIG. 1 shows circuitry including a data receiving circuit according to conventional art.
Figure 2:
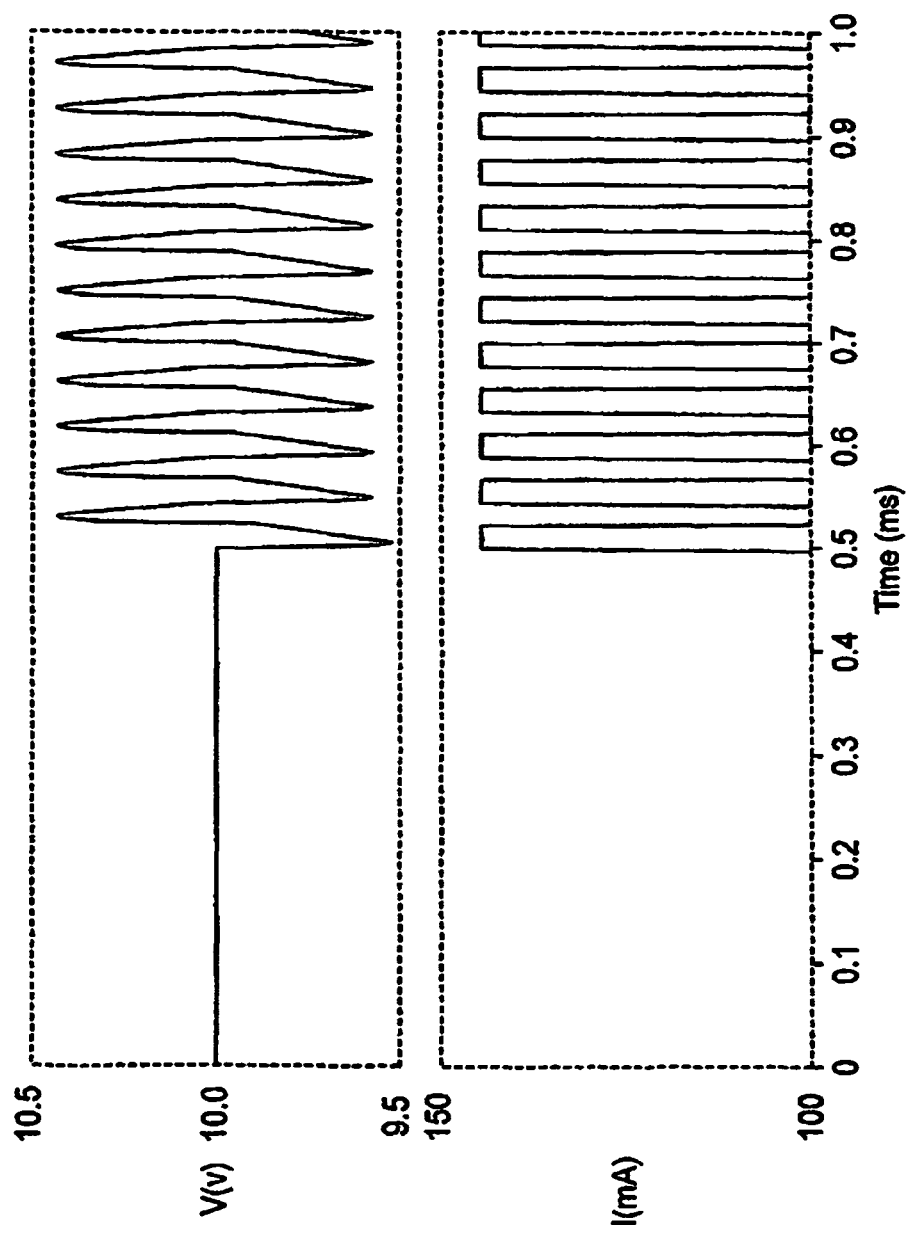
FIG. 2 shows exemplary waveforms related to the data receiving circuit of FIG. 1 in which the frequency of a current modulated signal is 22 kHz.
Figure 3:
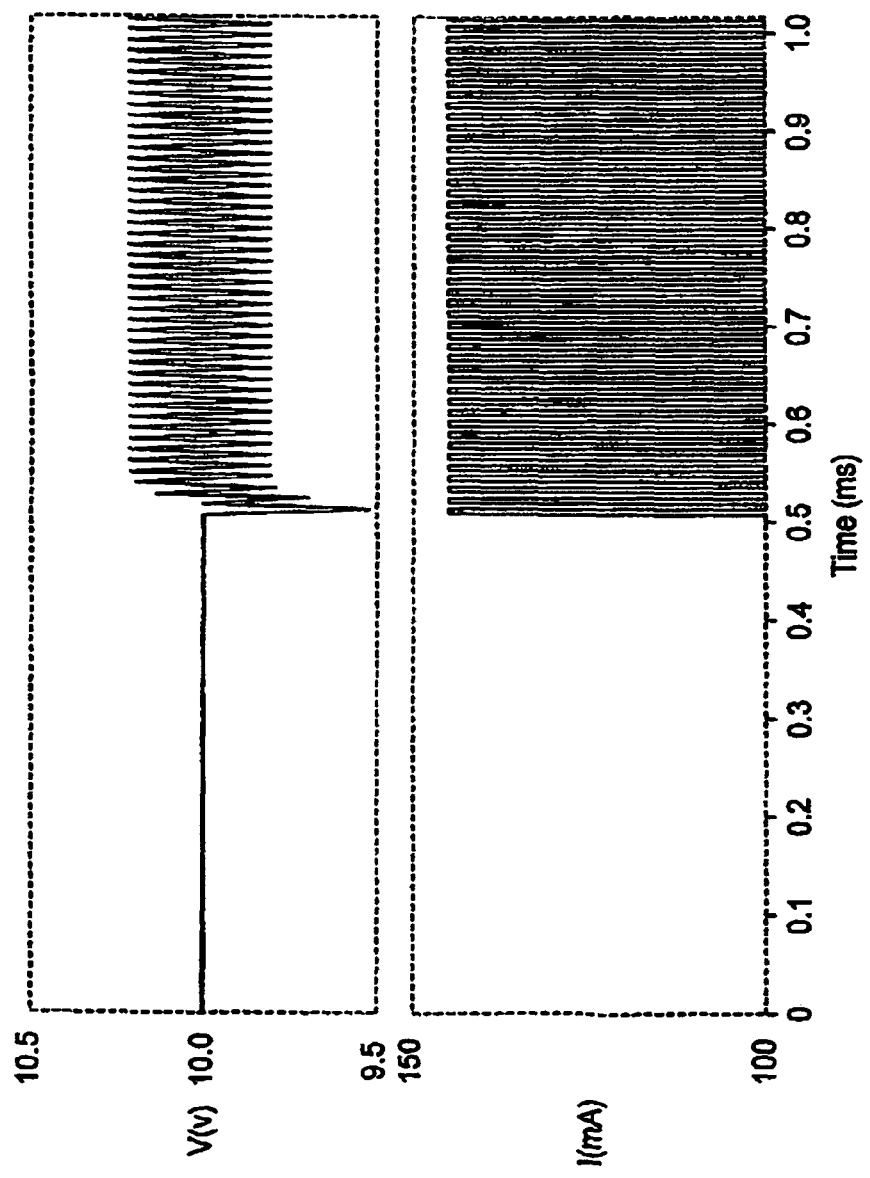
FIG. 3 shows exemplary waveforms related to the data receiving circuit of FIG. 1 in which the frequency of a current modulated signal is 88 kHz.
Figure 5:
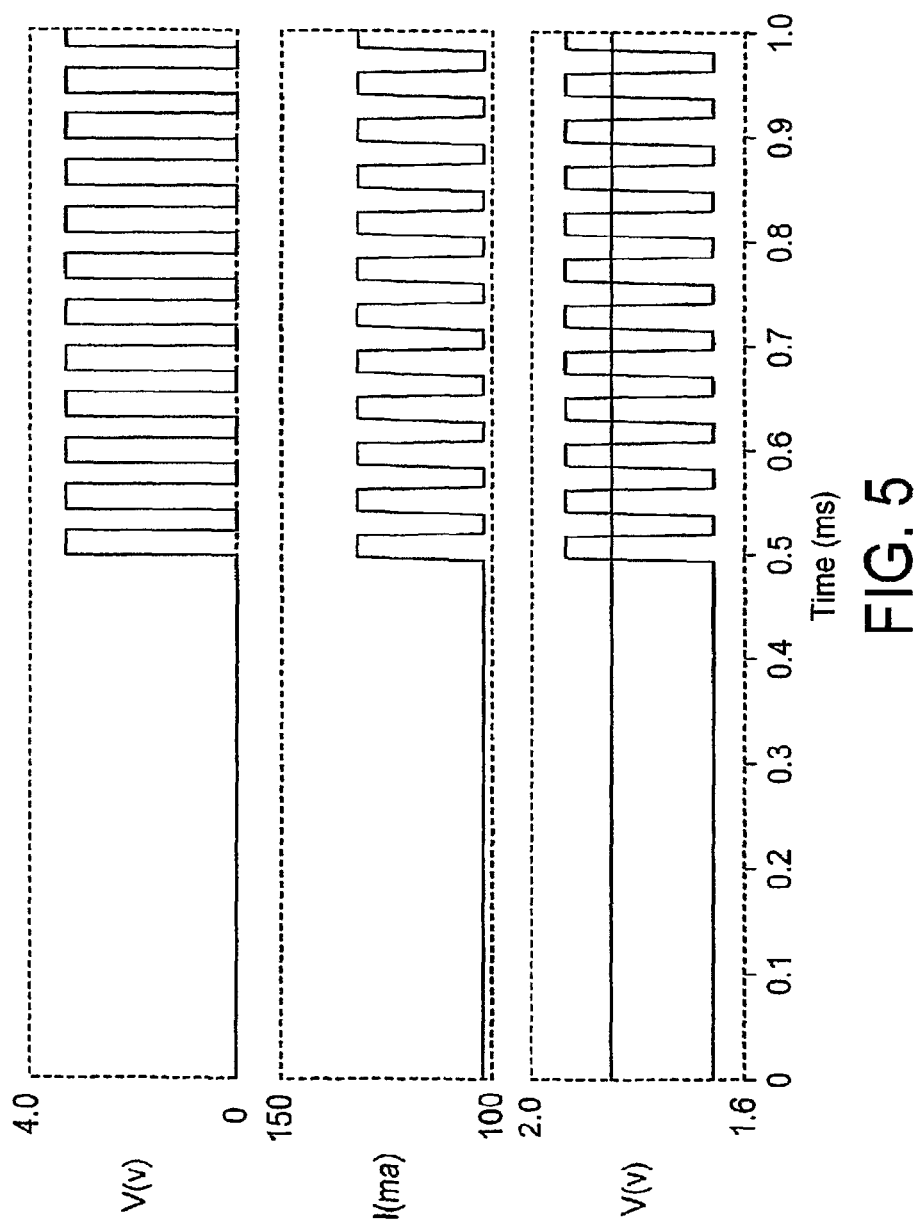
FIG. 5 shows exemplary waveforms related to the data receiving circuit of FIG. 4 in which the frequency of a current modulated signal is 22 kHz.

The data receiving circuit of FIG. 4 overcomes the problems associated with conventional data receiving circuits such as the RLC circuitry of FIG. 1 in that it is capable of properly receiving current modulated signals having a wide range of frequencies. The ability of the data receiving circuit of FIG. 4 to properly receive current modulated signals having a wide range of frequencies is evident from the waveforms shown in FIGS. 5 and 6. In FIG. 5, for example, waveforms are shown for: (i) a current modulated signal provided from external device 10 at a frequency of 22 kHz (i.e., middle waveform), (ii) the resultant converted voltage signal provided to the non-inverting (+) input terminal of comparator U18A along with the constant voltage signal provided to the inverting (−) input terminal of comparator U18A (i.e., lower waveform), and (iii) the resultant (i.e., sliced) digital output signal provided from comparator U18A (i.e., upper waveform).

Figure 6:
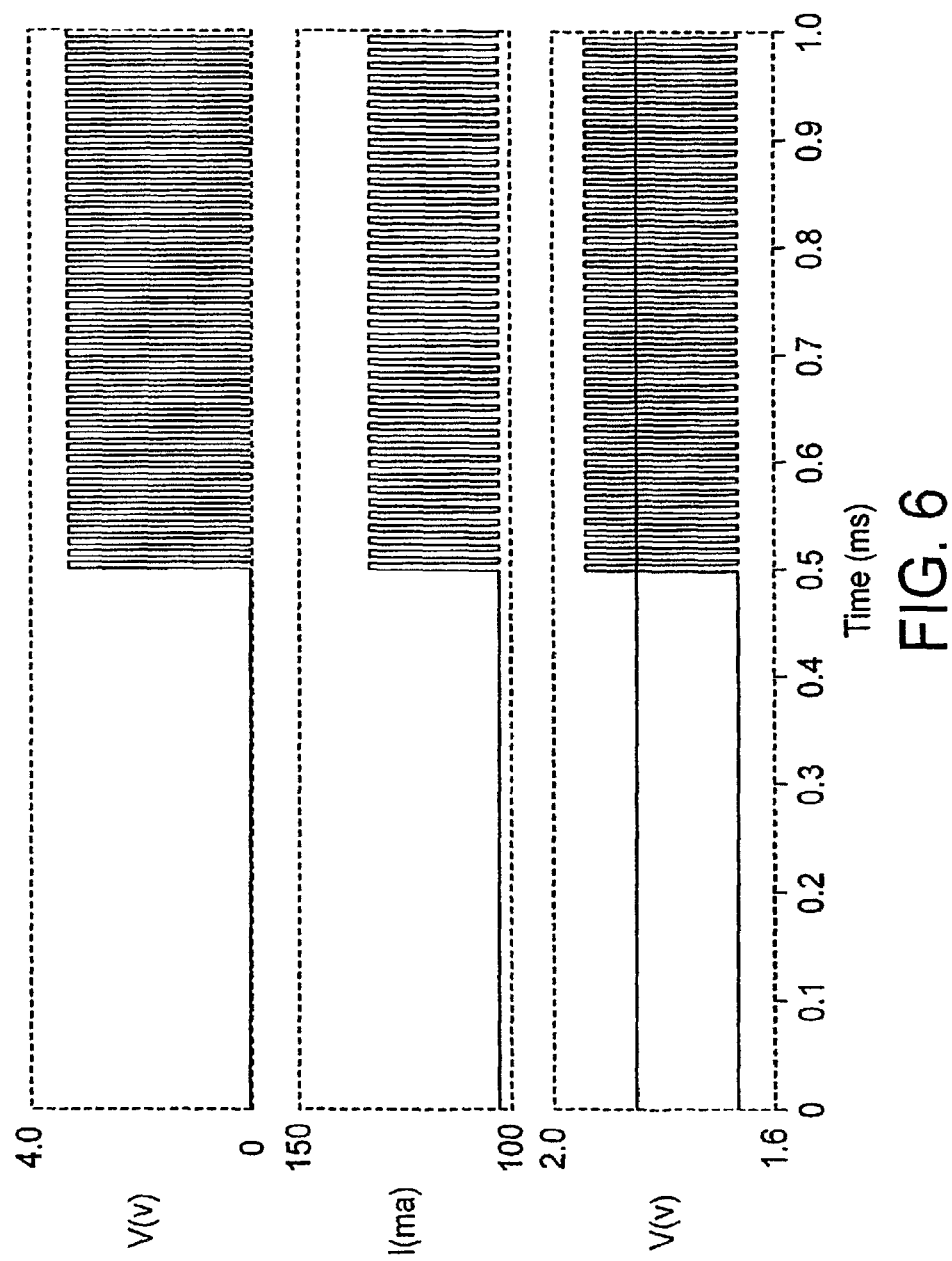
FIG. 6 shows exemplary waveforms related to the data receiving circuit of FIG. 4 in which the frequency of a current modulated signal is 88 kHz.

The waveforms of FIG. 5 may be compared to the waveforms of FIG. 6. In FIG. 6, waveforms are shown for: (i) a current modulated signal provided from external device 10 at a frequency of 88 kHz (i.e., middle waveform), (ii) the resultant converted voltage signal provided to the non-inverting (+) input terminal of comparator U18A along with the constant voltage signal provided to the inverting (−) input terminal of comparator U18A (i.e., lower waveform), and (iii) the resultant (i.e., sliced) digital output signal provided from comparator U18A (i.e., upper waveform). As indicated in FIGS. 5 and 6, signal amplitudes of the converted voltage signals provided to the non-inverting (+) input terminal of comparator U18A and the resultant (i.e., sliced) digital output signal provided from comparator U18A remain essentially constant despite the relatively significant frequency difference (i.e., 22 kHz versus 88 kHz). In this manner, the data receiving circuit of FIG. 4 advantageously avoids the frequency dependent nature of conventional data receiving circuits such as the one shown in FIG. 1.

As described herein, the present invention provides a data communication circuit that is capable of properly receiving current modulated signals having a wide range of frequencies. The present invention may be applicable to various apparatuses, either with or without an integrated display device. Accordingly, the phrase "television signal receiver" or "IRD apparatus" as used herein may refer to systems or apparatuses including, but not limited to, television sets, computers or monitors that include an integrated display device, and systems or apparatuses such as set-top boxes, video cassette recorders (VCRs), digital versatile disk (DVD) players, video game boxes, personal video recorders (PVRs), computers or other apparatuses that may not include an integrated display device.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

The invention claimed is:

1. A data receiving circuit, comprising:
a current mirror operative to receive a current modulated signal representing a data signal from an external device of a satellite receiving system and to convert said current modulated signal to a voltage signal, wherein said current mirror comprises first and second transistors operative to conduct a first current through a first signal path, third and fourth transistors operative to conduct a second current through a second signal path, wherein said first current is substantially equal to said second current and is proportional to a current exhibited by said current modulated signal; and
a data slicer operative to generate digital data representative of said data signal from said external device of a satellite receiving system, responsive to said voltage signal produced by said current mirror.

2. The data receiving circuit of claim 1, wherein said external device includes a low noise block of a satellite receiving system.

3. The data receiving circuit of claim 1, wherein said external device includes a switching unit of a satellite receiving system.

4. The data receiving circuit of claim 1, further comprising a capacitance operative to couple said voltage signal to said data slicer via said second signal path.

5. The data receiving circuit of claim 1, wherein:
said first, second, third and fourth transistors each include collector, base and emitter terminals;
said base terminal of said first transistor is operatively coupled to said base terminal of said third transistor; and
said base terminal of said second transistor is operatively coupled to said base terminal of said fourth transistor.

6. The data receiving circuit of claim 5, wherein:
said collector terminal of said first transistor is operatively coupled to said collector terminal of said second transistor; and
said collector terminal of said third transistor is operatively coupled to said collector terminal of said fourth transistor.

7. The data receiving circuit of claim 6, wherein:
said base terminals of said first and third transistors are operatively coupled to said collector terminals of said third and fourth transistors; and
said base terminals of said second and fourth transistors are operatively coupled to said collector terminals of said first and second transistors.

8. The data receiving circuit of claim 7, wherein:
said first and third transistors are pnp-type transistors; and
said second and fourth transistors are npn-type transistors.

9. A method for receiving a current modulated signal, comprising:
receiving said current modulated signal representing a data signal from an external device of a satellite receiving system;
using a current mirror to convert said current modulated signal to a voltage signal;
using first and second transistors of said current mirror to conduct a first current through a first signal path;
using third and fourth transistors of said current mirror to conduct a second current through a second signal path, wherein said first current is substantially equal to said second current; and
generating digital data representative of said data signal from said external device of a satellite receiving system, responsive to said voltage signal produced by said current mirror.

10. The method claim 9, wherein said external device includes a low noise block of a satellite receiving system.

11. The method of claim 9, wherein said external device includes a switching unit of a satellite receiving system.

12. The method of claim 9, further comprised of using a capacitance to couple said voltage signal to a data slicer via said second signal path, and wherein said data slicer generates said digital data.

13. The method of claim 9, wherein:
said first, second, third and fourth transistors each include collector, base and emitter terminals;
said base terminal of said first transistor is operatively coupled to said base terminal of said third transistor; and
said base terminal of said second transistor is operatively coupled to said base terminal of said fourth transistor.

14. The method of claim 13, wherein:
said collector terminal of said first transistor is operatively coupled to said collector terminal of said second transistor; and
said collector terminal of said third transistor is operatively coupled to said collector terminal of said fourth transistor.

15. The method of claim 14, wherein:
said base terminals of said first and third transistors are operatively coupled to said collector terminals of said third and fourth transistors; and
said base terminals of said second and fourth transistors are operatively coupled to said collector terminals of said first and second transistors.

16. The method of claim 15, wherein:
said first and third transistors are pnp-type transistors; and
said second and fourth transistors are npn-type transistors.

17. An apparatus, comprising:
  current mirroring means for receiving a current modulated signal representing a data signal from an external device of a satellite receiving system and converting said current modulated signal to a voltage signal, wherein said current mirroring means further comprises first and second switching means for conducting a first current through a first signal path and third and fourth switching means for conducting a second current through a second signal path, wherein said first current is substantially equal to said second current; and
  data slicing means for generating digital data representative of said data signal from said external device of a satellite receiving system, responsive to said voltage signal produced by said current mirror.

18. The apparatus of claim 17, wherein said external device includes a low noise block of a satellite receiving system.

19. The apparatus of claim 17, wherein said external device includes a switching unit of a satellite receiving system.

20. The apparatus of claim 17, further comprising capacitance means for coupling said current mirroring means to said data slicing means via said second signal path.

21. The apparatus of claim 17, wherein:
  said first, second, third and fourth switching means each include collector, base and emitter terminals;
  said base terminal of said first switching means is operatively coupled to said base terminal of said third switching means; and
  said base terminal of said second switching means is operatively coupled to said base terminal of said fourth switching means.

22. The apparatus of claim 21, wherein:
  said collector terminal of said first switching means is operatively coupled to said collector terminal of said second switching means; and
  said collector terminal of said third switching means is operatively coupled to said collector terminal of said fourth switching means.

23. The apparatus of claim 22, wherein:
  said base terminals of said first and third switching means are operatively coupled to said collector terminals of said third and fourth switching means; and
  said base terminals of said second and fourth switching means are operatively coupled to said collector terminals of said first and second switching means.

24. The apparatus of claim 23, wherein:
  said first and third switching means include pnp-type transistors; and
  said second and fourth switching means include npn-type transistors.

25. The apparatus of claim 17, wherein said apparatus is a television signal receiver.

* * * * *